United States Patent [19]
Liao et al.

[11] Patent Number: 5,514,908
[45] Date of Patent: May 7, 1996

[54] INTEGRATED CIRCUIT WITH A TITANIUM NITRIDE CONTACT BARRIER HAVING OXYGEN STUFFED GRAIN BOUNDARIES

[75] Inventors: De-Dui Liao, Richardson; Yih-Shung Lin, Plano, both of Tex.

[73] Assignee: SGS-Thomson Microelectronics, Inc., Carrollton, Tex.

[21] Appl. No.: 235,099

[22] Filed: Apr. 29, 1994

[51] Int. Cl.$^6$ .......................... H01L 23/48; H01L 23/52; H01L 29/40
[52] U.S. Cl. .......................... 257/751; 257/757; 257/764; 257/767; 257/770; 257/924
[58] Field of Search .................................... 257/770, 924, 257/757, 767, 763, 764, 751

[56] References Cited

U.S. PATENT DOCUMENTS

| | | | |
|---|---|---|---|
| 4,957,590 | 9/1990 | Douglas | 156/643 |
| 4,976,839 | 12/1990 | Inoue | 204/192.17 |
| 5,070,036 | 12/1991 | Stevens | 257/760 |
| 5,162,262 | 11/1992 | Ajika et al. | 437/200 |
| 5,175,126 | 12/1992 | Ho et al. | 437/190 |
| 5,232,871 | 8/1993 | Ho | 437/190 |
| 5,371,042 | 12/1994 | Ong | 437/194 |

FOREIGN PATENT DOCUMENTS

| | | | |
|---|---|---|---|
| 1275332 | 10/1990 | Canada . | |
| 0545602A1 | 6/1993 | European Pat. Off. . | |
| 551117A2 | 7/1993 | European Pat. Off. | 257/915 |
| 3153024 | 7/1991 | Japan . | |
| 5036627 | 2/1993 | Japan . | |

OTHER PUBLICATIONS

Wittmer, "Properties and microelectronic applications of thin films of refractory metal nitrides", *J. Vac. Sci. Technol. A*, vol. 3, No. 4 (Jul./Aug. 1985), pp. 1797–1803.

van Gough, et al., "Characterization of Improved TiN Films by Controlled Divergence Sputtering", *Proceedings of IEEE VLSI Multilevel Interconnect Conference* (Santa Clara, CA; 1992), pp. 310–313.

Inoue, et al., "The Properties of Reactive Sputtered TiN Films for VSLI Metallization", *Proceedings of IEEE VLSI Multilevel Interconnect Conference*, (Santa Clara, CA; 1988) pp. 205–211.

Tsai, et al., "Electrical Conductivity of Reactively–Sputtered TiN", *Proceedings of IEEE VLSI Multilevel Interconnect Conference* (Santa Clara, CA; 1992), pp. 283–285.

Williams, et al., "Nitrogen, oxygen, and argon incorporation during reactive sputter position of titanium nitride", *J. Vac. Sci. Technol. B*, vol. 5, No. 6 (Nov./Dec. 1987), pp. 1723–1729.

Hashimoto, et al., "Bias–induced structure transition in reactively sputtered TiN films", *Appl. Phys, Lett.*, vol. 54, No. 2 (9 Jan. 1989), pp., 120–122.

(List continued on next page.)

*Primary Examiner*—Jerome Jackson, Jr.
*Assistant Examiner*—John Guay
*Attorney, Agent, or Firm*—Rodney M. Anderson; Irena Lager; Lisa K. Jorgenson

[57] ABSTRACT

Methods of forming, in an integrated circuit, aluminum-silicon contacts with a barrier layer is disclosed. The barrier layer is enhanced by the provision of titanium oxynitride layers adjacent the silicide film formed at the exposed silicon at the bottom of the contact. The titanium oxynitride may be formed by depositing a low density titanium nitride film over a titanium metal layer that is in contact with the silicon in the contact; subsequent exposure to air allows a relatively large amount of oxygen and nitrogen to enter the titanium nitride. A rapid thermal anneal (RTA) both causes silicidation at the contact location and also results in the oxygen and nitrogen being gettered to what was previously the titanium/titanium nitride interface, where the oxygen and nitrogen react with the titanium metal and nitrogen in the atmosphere to form titanium oxynitride. The low density titanium nitride also densifies during the RTA. Alternative embodiments are also disclosed in which the silicide is formed first, prior to the formation of additional titanium oxynitride by air exposure and RTA, or by sputter deposition. Each of these processes produces a high-quality barrier contact structure overlying a silicide film, where the barrier structure includes titanium oxynitride and titanium nitride.

9 Claims, 9 Drawing Sheets

OTHER PUBLICATIONS

Sinke, et al., "Oxygen in titanium nitride diffusion barriers", *Appl. Phys. Lett.*, vol. 47, No. 5 (1 Sep. 1985), pp. 471–473.

Dixit, et al., "Reactively sputtered titanium nitride films for submicron contact barrier metallization," *Appl. Phys. Lett.*, vol. 62, No. 4, (25 Jan. 1993) pp. 357–359.

Kattelus, et al., "Bias–induced stress transitions in sputtered TiN films", *J. Vac. Sci. Techno. A*, vol. 4, No. 4 (Jul./Aug. 1986), pp. 1850–1854.

INTEGRATED CIRCUIT WITH A TITANIUM NITRIDE CONTACT BARRIER HAVING OXYGEN STUFFED GRAIN BOUNDARIES

This invention is in the field of integrated circuits, and is more specifically directed to processes for forming metal-to-semiconductor contacts in the same.

BACKGROUND OF THE INVENTION

In the field of integrated circuit manufacture, particularly with the continuing trend toward smaller integrated circuit feature sizes, the making of high-reliability conductive electrical contacts between metallization layers and semiconductor elements, particularly contacts between aluminum and diffused junctions into single-crystal silicon, has become more difficult. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause aluminum atoms to diffuse from a metal electrode of pure aluminum into single-crystal silicon to such a depth as to short out a shallow p-n junction in the silicon; this phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

Accordingly, recent advances in the field of integrated circuit fabrication have been made by the introduction of so-called "barrier" layers at the aluminum-silicon contact. Conventionally, the barrier layer is a refractory metal compound such as titanium-tungsten (TiW), or a refractory metal nitride such as titanium nitride (TiN). The barrier layer is formed at the contact locations so as to be disposed between the silicon and the overlying aluminum layer. In some cases, the barrier layer is formed by deposition of the refractory metal, followed by an anneal which forms both the barrier layer compound and also a metal silicide where the metal is in contact with the silicon; as is known in the art, the metal silicide improves the conductivity of the contact. In any case, the barrier layer inhibits the interdiffusion of aluminum and silicon atoms, thus eliminating the problems of junction spiking and silicon nodule formation noted above.

Other techniques for improving the barrier properties of TiN layers have included the enhancement of the barrier by manipulating and controlling parameters in the deposition of the TiN film. U.S. Pat. No. 4,976,839, issued Dec. 11, 1990 and incorporated hereinto by reference, discloses that the presence of an oxide at grain boundaries within a titanium nitride film improves the ability of the film to prevent the mutual diffusion of silicon and aluminum therethrough. This reference also discloses a method for forming a titanium nitride barrier layer having large grain sizes by increasing the substrate temperature during sputtering, so that the formation of oxides at the grain boundaries may be accomplished with a relatively large amount of oxygen present, but without degradation in the conductivity of the film. Such control of substrate temperature to enhance the TiN barrier is also described in Inoue et al., *Proceedings of IEEE VLSI Multilevel Interconnect Conference*, (IEEE, 1988) p.205 et seq. TiN deposition parameters other than substrate temperature have also been controlled in efforts to enhance the barrier properties of the film. These parameters include deposition pressure and substrate bias voltage. Each of these prior techniques have been directed to deposit a more densified, or crystallized, TiN film, with the intent that the film has improved barrier properties.

Other known techniques for enhancing TiN barrier properties have included the use of post-deposition treatments of the film by stuffing the TiN film with oxygen. Sinke et al., *Appl. Phys. Lett.*, Vol. 47, No. 5, (1985) p. 471 et seq., describes the use of air exposure as such a treatment. Dixit et al., *Appl. Phys. Lett.*, Vol. 62, No. 4, (1993) p. 357 et seq., describes the use of rapid thermal anneal (RTA) as another post-deposition treatment of TiN film.

It is an object of the present invention to provide a method of forming an integrated circuit in which a barrier layer at contact locations may be formed in such a manner as to provide excellent interdiffusion barrier properties.

It is a further object of the present invention to provide such a method that is useful in extremely small contact openings, including those of below one micron.

It is a further object of the present invention to provide such a method that has a high degree of process robustness.

Other objects and advantages of the present method will be apparent to those of ordinary skill in the art having reference to the following specification together with the drawings.

SUMMARY OF THE INVENTION

The invention may be incorporated into a method of fabricating an integrated circuit that includes the formation of barrier layers at contact locations. After the formation of the contact opening through the dielectric opening to expose silicon at the contact locations, the present invention forms a titanium silicide layer at the exposed silicon over which a titanium nitride film is formed, and where a titanium oxynitride layer is formed between the titanium silicide and the titanium nitride. According to one aspect of the invention, a porous titanium nitride layer is formed over the titanium metal from which the silicide is to be formed. Exposure of the wafer to an oxygen-bearing atmosphere (including air) after formation of the porous titanium nitride allows oxygen to enter the film; subsequent rapid thermal anneal causes both silicidation at the silicon-titanium interface, and also causes the titanium nitride to densify into a high density film with a titanium oxynitride layer at the silicide/nitride interface.

According to another aspect of the invention, the titanium metal may be sputtered and followed by deposition of a titanium oxynitride film, in situ with the metal sputtering; a titanium nitride film may then be formed over both, optionally followed by RTA. This aspect of the invention enables the sputtering of the barrier layer in situ with the metal deposition, reducing handling of the wafers.

DETAILED DESCRIPTION OF THE PREFERRED EMBODIMENTS

Referring now to FIGS. 1a through 1e, a method of fabricating an integrated circuit to have a barrier layer at its contact openings according to a first embodiment of the invention will now be described in detail. The cross-sections of FIGS. 1a through 1e illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1A:
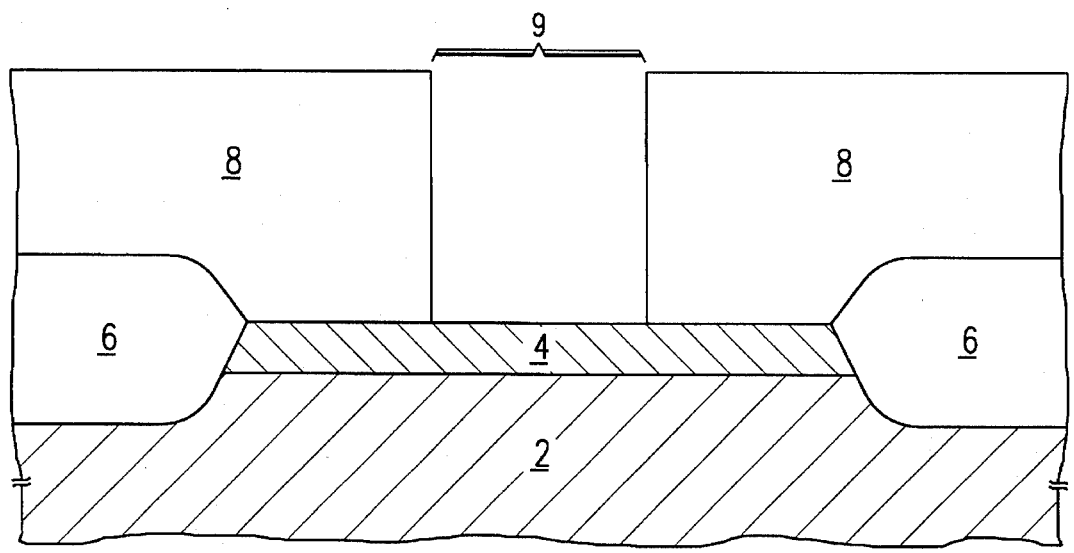
FIGS. 1a through 1e are cross-sectional views of a partially manufactured integrated circuit illustrating steps of a fabrication process according to a first preferred embodiment of the invention.

FIG. 1a illustrates, in cross-section, a portion of an integrated circuit that has been partially fabricated. According to the example described herein, the present invention is directed to forming a barrier layer between an aluminum metallization layer and a doped semiconductor region in single-crystal silicon, as such contacts are generally the most sensitive to the spiking and nodule problems addressed by barrier layers. It is contemplated, of course, that the present invention will also be applicable to the formation of other contacts, including, for example, contacts between metallization and polysilicon.

The structure of FIG. 1a includes silicon substrate 2, into a surface of which doped diffusion region 4 is formed, of opposite conductivity type from that of substrate 2. For example, substrate 2 may be lightly doped p-type silicon and diffusion region 4 may be heavily doped n-type silicon. Of course, as noted above, other structures (with the same or opposite conductivity type selection) may alternatively be used; for example, substrate 2 may instead be a well or tub region in a CMOS process, into which diffusion 4 is formed. In the example of FIG. 1a, diffusion 4 is bounded by field oxide structure 6, formed in the conventional manner. In this example, diffusion 4 is very shallow, such as on the order of 0.15 microns, as is conventional for modern integrated circuits having sub-micron feature sizes. As such, diffusion 4 may be formed by ion implantation of the dopant followed by a high-temperature anneal to form the junctions, as is well known in the art; alternatively, the ion implantation may be performed prior to the formation of subsequent layers, with the drive-in anneal performed later in the process, if desired.

Dielectric layer 8, which may be a deposited oxide or another type of dielectric layer, is formed over diffusion 4 and field oxide 6, for purposes of electrically isolating overlying conductive structures from diffusion 4, except at locations where contacts therebetween are desired. In FIG. 1a, contact opening 9 has been formed through dielectric layer 8, for example by way of reactive ion etching or another type of anisotropic etching; as will be apparent below, this embodiment of the invention is concerned with the formation of an overlying metallization and barrier structure that is in contact with diffusion 4 through contact opening 9. In this example, contact opening 9 may be as small as less than one micron in width, as is typical for modern sub-micron integrated circuits.

Each of the structures illustrated in FIG. 1a may be formed according to conventional process steps in the art of integrated circuit manufacture.

Figure 1B:
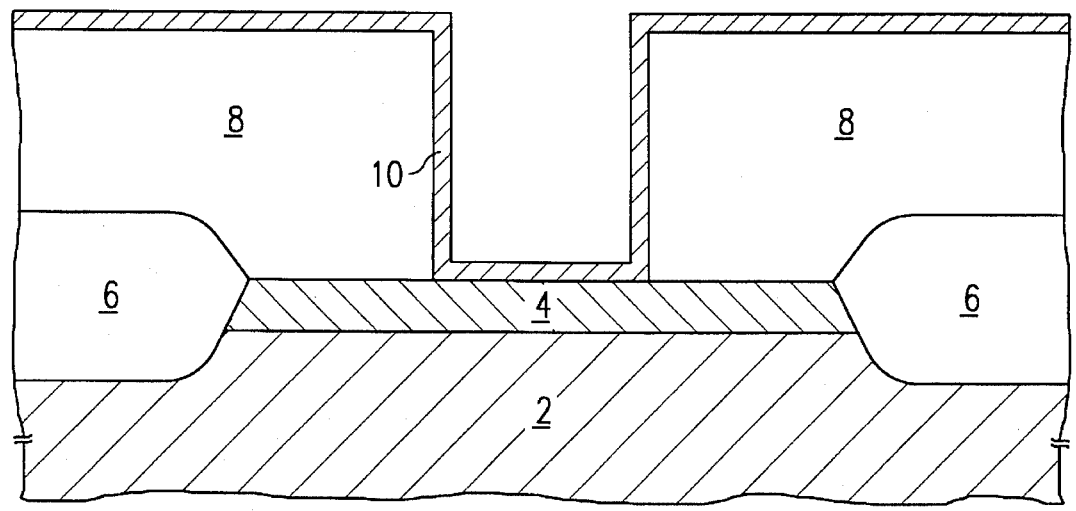

After completion of the structure illustrated in FIG. 1a, a thin layer 10 of titanium metal is deposited overall, resulting in the structure illustrated in FIG. 1b. Titanium layer 10 is preferably formed by way of sputtering, to a thickness of on the order of 300 to 1000 Å; the thickness of titanium layer 10 is selected according to the thickness of the silicide layer that is to be formed at the contact location (as will be described in detail below). In this example, the thickness of titanium layer 10 is approximately 600 Å.

Figure 1C:
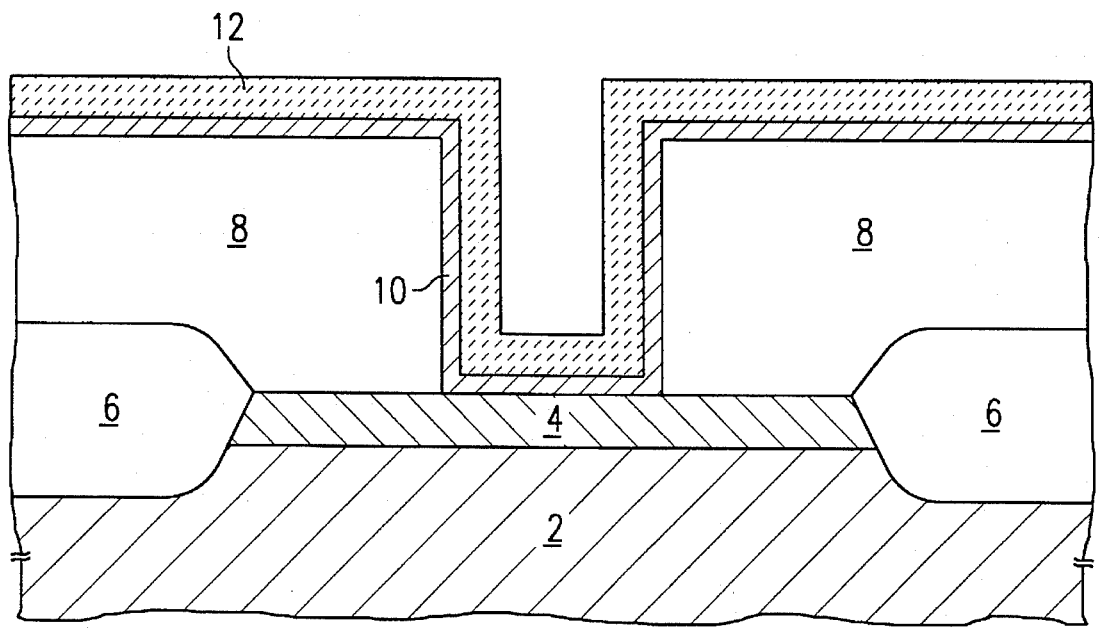

Following the formation of titanium layer 10, a layer 12 of titanium nitride is then formed overall, resulting in the structure of FIG. 1c. According to this embodiment of the invention, titanium nitride layer 12 is intentionally formed to have a relatively low density. The preferred method for the deposition of titanium nitride layer 12 is by way of reactive sputtering, in which titanium metal is sputtered in a nitrogen-bearing atmosphere under temperature, pressure and bias conditions that enables the reaction of the sputtered titanium ions with the nitrogen in the atmosphere. The low density of titanium nitride layer 12 is created by proper selection of the substrate temperature and the sputtering chamber pressure. For example, reactive sputtering of titanium nitride at relatively cool substrate temperatures of on the order of 100° C. and at relatively weak vacuum conditions (on the order of 10 mTorr), has been found to provide quite a low density film of titanium nitride. This is in contrast to conventional high density titanium nitride, which is sputtered at substrate temperatures on the order of 300° C. and vacuums of at most 4 mTorr to provide the large grain sizes and high density desired in the prior art. As a result of the sputtering conditions according to this first preferred embodiment of the invention, low density titanium nitride film 12 is therefore quite porous at this stage of the process. The thickness of titanium nitride layer 12 is on the order of 300 to 1000 Å according to this embodiment of the invention; a preferred thickness of titanium nitride layer is approximately 1000 Å, for a particular application.

It is preferred that titanium nitride layer 12 may be formed in situ with the sputtering of titanium layer 10, with the temperature, pressure and atmosphere being changed upon completion of the titanium layer 10. Alternatively, the sputtering of titanium nitride layer 12 may be performed in a different processing chamber from the sputtering of titanium layer 10, as desired. After the deposition of titanium nitride layer 12, it is also preferred to sputter a thin (e.g., 200 Å) layer of titanium metal (not shown) thereover in order to clean the sputtering target; if used, this additional titanium layer will later react to form titanium nitride, and as such will not significantly change the resulting structure.

Following the deposition of titanium nitride layer 12, the structure is removed from the processing chamber and exposed to an oxygen-bearing atmosphere, and preferably an atmosphere such as air that bears both oxygen and nitrogen. It is believed that the oxygen molecules in the atmosphere (and also nitrogen molecules, if present) diffuse into titanium nitride layer 12 along its grain boundaries. The low density titanium nitride layer 12 formed as described above ensures such infiltration of oxygen (and nitrogen) thereinto during this exposure, in contrast to conventionally formed titanium nitride layers having high density and large grain sizes, in which the infiltration of oxygen and nitrogen is inhibited. It has been observed that the infiltration of oxygen into low density titanium nitride layer 12 occurs substantially immediately (i.e., on the order of a few minutes), with longer exposures not having a significant effect on the eventual film. As such, the time and conditions of the air exposure of titanium nitride layer 12 are not at all critical.

Following the air exposure of titanium nitride layer 12, the structure undergoes an anneal, preferably a rapid thermal anneal (RTA), in order to form an underlying silicide at the bottom of contact opening 9 and to react the infiltrated oxygen and nitrogen with titanium layer 10, at the interface between titanium layer 10 and titanium nitride layer 12. RTA is preferred for this step, to minimize oxidation of the elemental titanium metal in layer 10. It has been observed that the specific conditions of the RTA are not believed to be critical, so long as the RTA is adequate to direct react the titanium layer 10 at the locations adjacent diffusion region 4 to form titanium disilicide ($TiSi_2$) thereat. The RTA also densifies titanium nitride layer 12 to a more compact structure. An example of RTA useful according to this embodiment of the invention is a 650° C. anneal in nitrogen ambient, for 30 seconds.

Figure 1D:
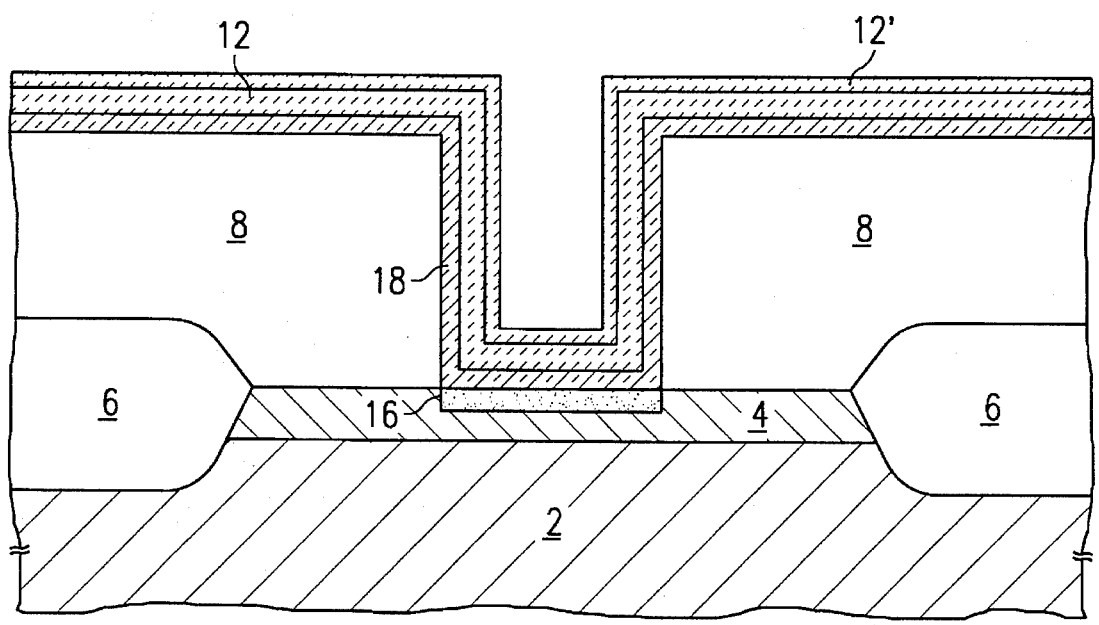

FIG. 1d illustrates the exemplary structure after the RTA process has been performed. Titanium disilicide layer 16 is formed at the exposed portion of diffusion 4, which was previously in contact with titanium layer 10; assuming selection of the proper thickness of titanium layer 10, the consumption of silicon of diffusion 4 in the formation of silicide layer 16 is limited, so that silicide layer 16 does not extend through diffusion 4 and short out the junction between diffusion 4 and substrate 2.

As shown in FIG. 1d, as a result of the air exposure of low density titanium nitride layer 12 prior to RTA, and the infiltration of oxygen thereinto during such exposure, titanium oxynitride (TiON) layer 18 is formed at what was previously the interface between titanium layer 10 and titanium nitride layer 12, both at locations in contact with silicide layer 16 and also over dielectric layer 8. It is believed that TiON layer 18 is formed by oxygen gettering at this interface during RTA, with the oxygen reacting with titanium layer 10 and available nitrogen thereat to form the TiON compound. It is believed that the portion of titanium nitride layer 12 nearest to titanium layer 10 will be somewhat depleted of oxygen, which is gettered to the titanium/titanium nitride interface. The particular stoichiometry of the titanium oxynitride will vary according to the particular conditions, such that the layer 18 can, at best be referred to as $TiO_xN_y$. The thickness of titanium oxynitride layer 18 is, in this example, on the order of 100 to 300 Å.

The thickness of titanium nitride layer 12 is preferably limited to that which ensures that the full thickness of titanium layer 10 over dielectric layer 8 reacts, during the RTA, to form either titanium silicide or the titanium oxynitride compound. It is undesirable for elemental titanium to remain in the film at this point, as this elemental titanium would oxidize during subsequent process steps.

It has also been observed that the upper portion of titanium nitride layer 12 is "stuffed" with oxygen as a result of the air exposure followed by RTA; this stuffed region is illustrated in FIG. 1d by layer 12'. In this example, the thickness of oxygen-stuffed titanium nitride layer 12' is on the order of 300 to 500 Å.

Figure 1E:
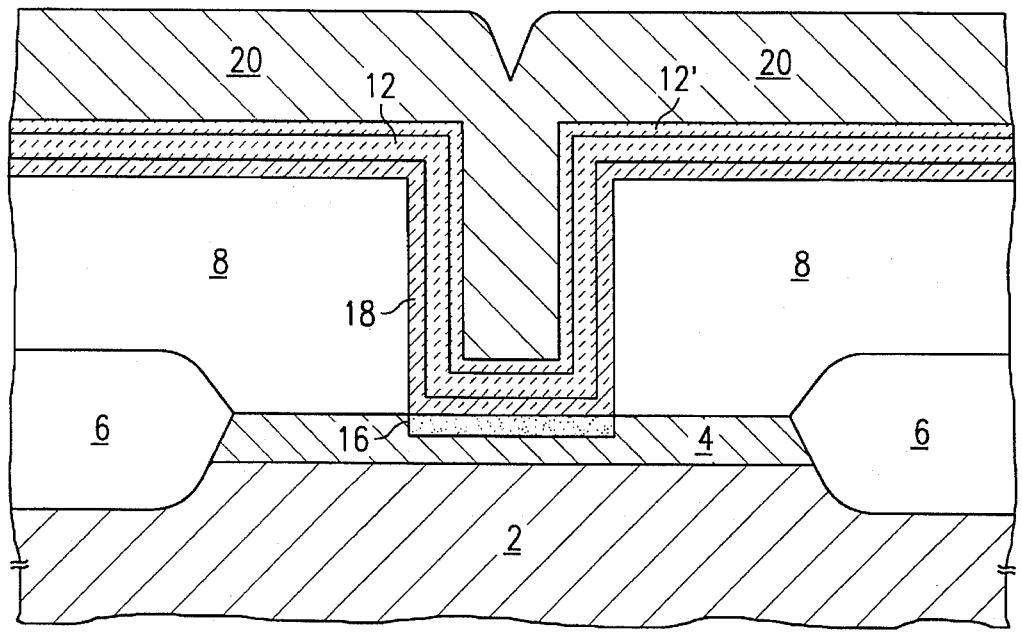
Figure 2:
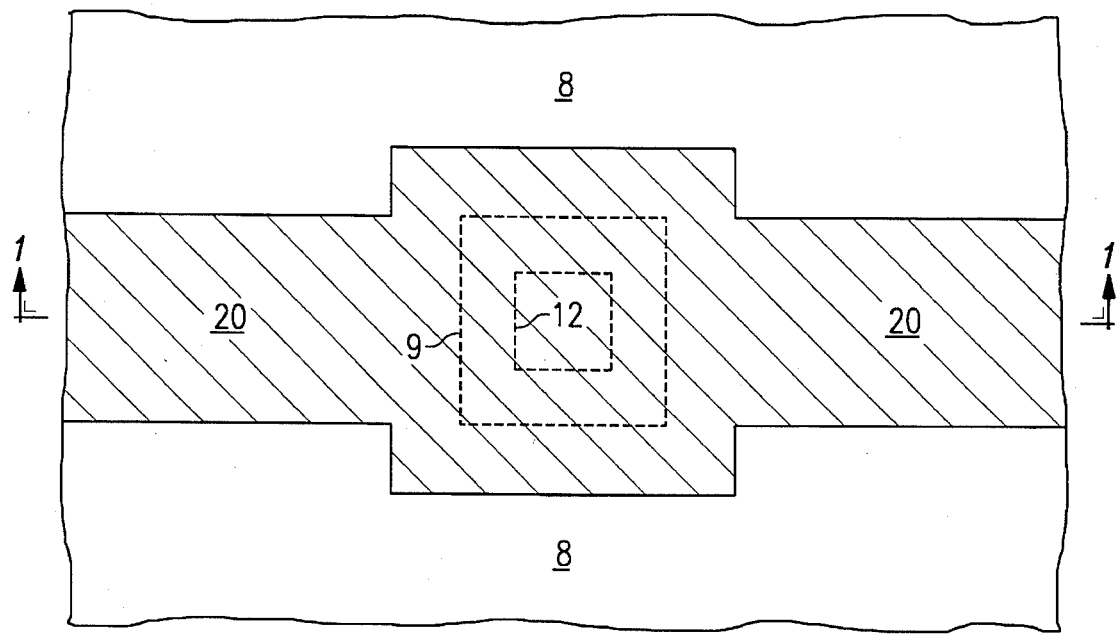
FIG. 2 is a plan view of the integrated circuit of FIGS. 1a through 1e, shown after the step corresponding to FIG. 1e.

As shown in FIG. 1e, following the RTA step, aluminum metallization 20 may be evaporated or sputtered over the structure to the desired thickness. Aluminum layer 20 may consist of pure aluminum, or aluminum doped with silicon or copper, as is conventional in the art. In this example, the thickness of aluminum layer 20 may be on the order of 4000 to 8000 Å. Following the deposition of aluminum layer 20, conventional patterning and etching of the stack of titanium oxynitride 18, titanium nitride 12, 12', and aluminum layer 20 is performed as conventional in the art to form the conductors desired in the particular integrated circuit. FIG. 2 illustrates, in plan view, the portion of the integrated circuit structure of FIG. 1e; the location of contact opening 9 and the inner edges of titanium nitride layer 12 are shown in shadow in the plan view of FIG. 2.

According to this embodiment of the invention, the barrier formed by the structure of titanium oxynitride layer 18, titanium nitride layer 12, and oxygen-stuffed titanium nitride layer 12' has been observed to be of high quality and integrity. Indeed, experiment has shown that the barrier structure according to the present invention, when applied to diode test structures, results in a lower percentage of reverse bias diode leakage failures after thermal stress at 450° C., as compared with similarly sized diodes having conventional barrier layers such as high density titanium nitride disposed over titanium metal (both subjected to RTA and not subjected to RTA).

It is believed that the improved barrier performance provided by the structure according to this embodiment of the invention is due to the formation of titanium oxynitride layer 18 at what was the interface between titanium layer 10 and low density titanium nitride layer 12. The formation of this layer, according to this embodiment of the invention, was enabled by the low density nature of titanium nitride layer 12 as deposited, which is stuffed with oxygen 12 during the exposure of the structure to air or another oxygen-bearing atmosphere, after deposition. During the subsequent RTA operation, this stuffed oxygen is gettered by titanium layer 10, and reacts thereat to form TiON layer 18.

EXPERIMENTAL RESULTS

Single-crystal p-type silicon wafers were processed with conventional CMOS technology, to fabricate n+/p test diode strings for investigation of this first embodiment of the invention. The diode strings included shallow n+ diffusion regions formed by an arsenic implant ($3 \times 10^{15}$ dose at 60 KeV), a phosphorous implant ($3 \times 10^4$ dose at 65 KeV), and a 900° C. furnace anneal for thirty minutes to form the junctions. After oxide deposition, one micron contacts were made to the diffused regions, to be connected in parallel (in groups of $10^5$ diodes), each diode having an area of 0.0635 $cm^2$.

To investigate the mechanism of the formation of the TiON layer described above, six barrier/metal structure schemes were compared. Each test group first received 550 Å of sputtered titanium. Three groups received low density sputtered titanium nitride film (500 Å) produced as described above relative to this embodiment of the invention, and three groups received high density sputtered titanium nitride film (500 Å) in the conventional manner. Aluminum was deposited over each test group, either in situ, after an air break, and after both an air break and an RTA anneal at 650° C. The six test groups may be summarized as follows:

a) Ti/low density TiN/in situ Al
b) Ti/high density TiN/in situ Al
c) Ti/low density TiN/Al after air break d) Ti/high density TiN/Al after air break e) Ti/low density TiN/Al after air break and RTA f) Ti/high density TiN/Al after air break and RTA Group (e) corresponds to the first preferred embodiment of the invention described hereinabove relative to FIGS. 1a through 1e, and FIG. 2.

The low density and high density nature of the titanium nitride films was confirmed by electrical conductivity measurements (low density TiN having average resistivities of 1120 μohm-cm and 1640 μohm-cm after air break, but before and after RTA, respectively; high density TiN having average resistivities of 90 μohm-cm after air exposure both before and after RTA).

X-ray diffraction measurements of the six groups of film also confirmed that the low density TiN film indeed had low density as deposited, based on d-spacing measurements. These x-ray diffraction measurements also indicated that low-density TiN, formed according to the first preferred embodiment of the invention, densifies when subjected to RTA into a higher density than that of conventional high density TiN. These results are shown in the following table of the six test groups indicated above, where "d" is the measured lattice constant for the specified material and plane, and where "ratio" is the ratio of the measured lattice constant for the group relative to the ideal lattice constant for the specified material and plane:

TABLE 1

|  | Ti(002) | Ti(011) | TiN(111) |
|---|---|---|---|
| Group (a): Ti/low density TiN/in situ Al | | | |
| d | 2.346 | — | 2.464 |
| (ratio) | (1.002) | — | (1.010) |
| Group (b): Ti/high density TiN/in situ Al | | | |
| d | 2.342 | 2.243 | 2.457 |
| (ratio) | (1.000) | (1.000) | (1.007) |
| Group (c): Ti/low density TiN/Al after air break | | | |
| d | 2.346 | — | 2.469 |
| (ratio) | (1.002) | — | (1.012) |
| Group (d): Ti/high density TiN/Al after air break | | | |
| d | 2.343 | 2.243 | 2.455 |
| (ratio) | (1.001) | (1.000) | (1.006) |
| Group (e): Ti/low density TiN/Al after air break and RTA | | | |
| d | 2.387 | — | 2.431 |
| (ratio) | (1.019) | — | (0.996) |
| Group (f): Ti/high density TiN/Al after air break and RTA | | | |
| d | 2.375 | 2.255 | 2.444 |
| (ratio) | (1.014) | (1.005) | (1.002) |

As is evident from the table, the low density TiN film of groups (a) and (c), which have not been subjected to RTA, in fact have relatively large TiN(111) lattice constants (ratios of 1.010 and 1.012, respectively), relative to those of high density TiN films of groups (b) and (d) that have undergone similar processing without RTA (ratios of 1.007 and 1.006, respectively). However, the data in the Table clearly shows that the TiN film of group (e), which is of low density as deposited, is densified by the RTA to a higher density and lower lattice constant (ratio of 0.996) than that of the high density (as deposited) TiN film of group (f) that is subjected to RTA (ratio of 1.002). This data indicates the additional benefit of this first preferred embodiment of the invention, in that a higher density TiN film is obtained by the RTA processing of a TiN film that has a low density as deposited.

Figure 3A:
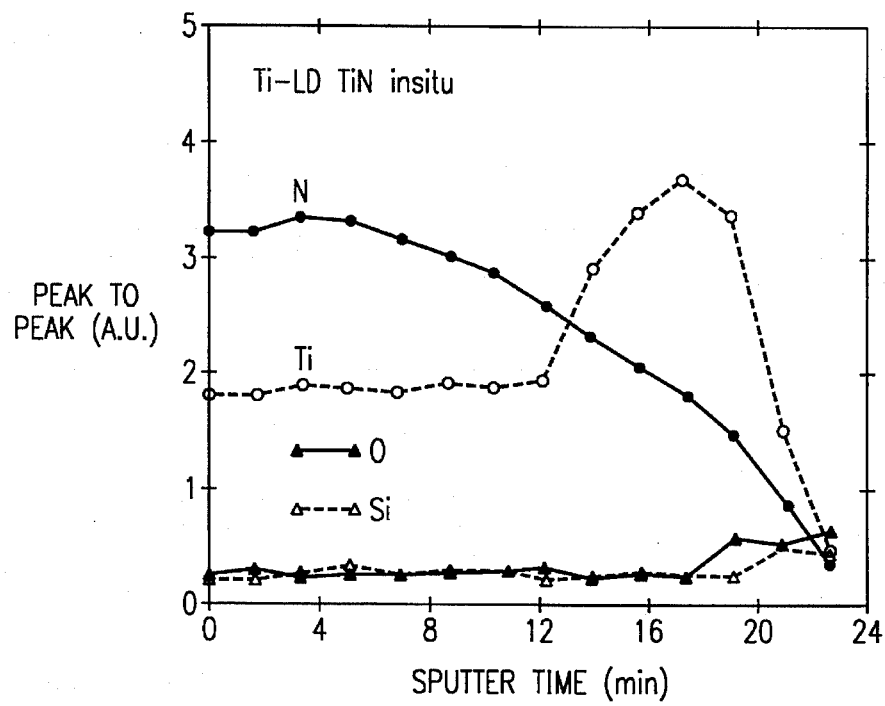
FIGS. 3a through 3f are Auger electron spectroscopy results for six test groups in an experimental verification of the mechanism by way of which the first embodiment of the invention provides improved barrier protection.
Figure 3B:
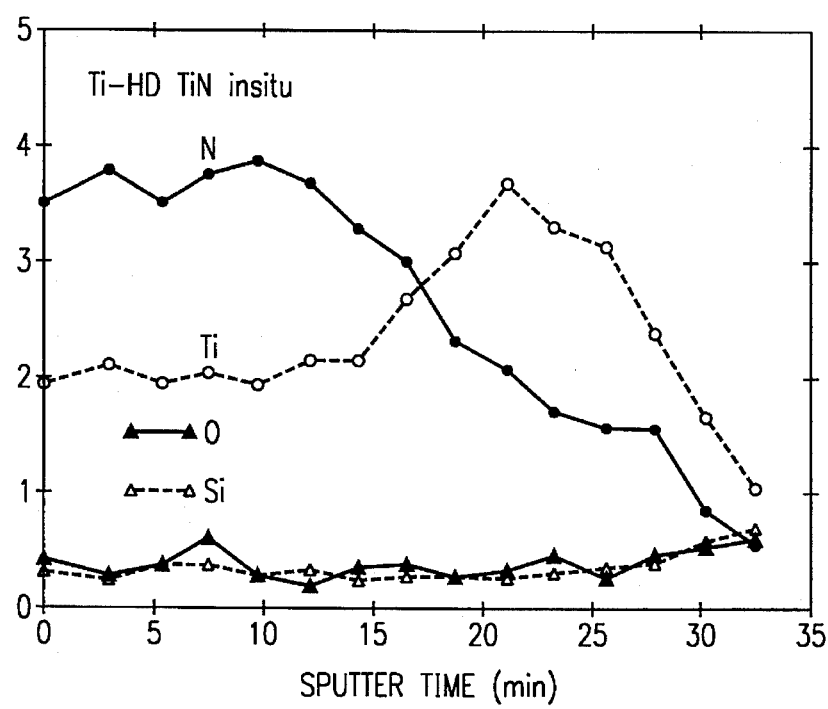
Figure 3C:
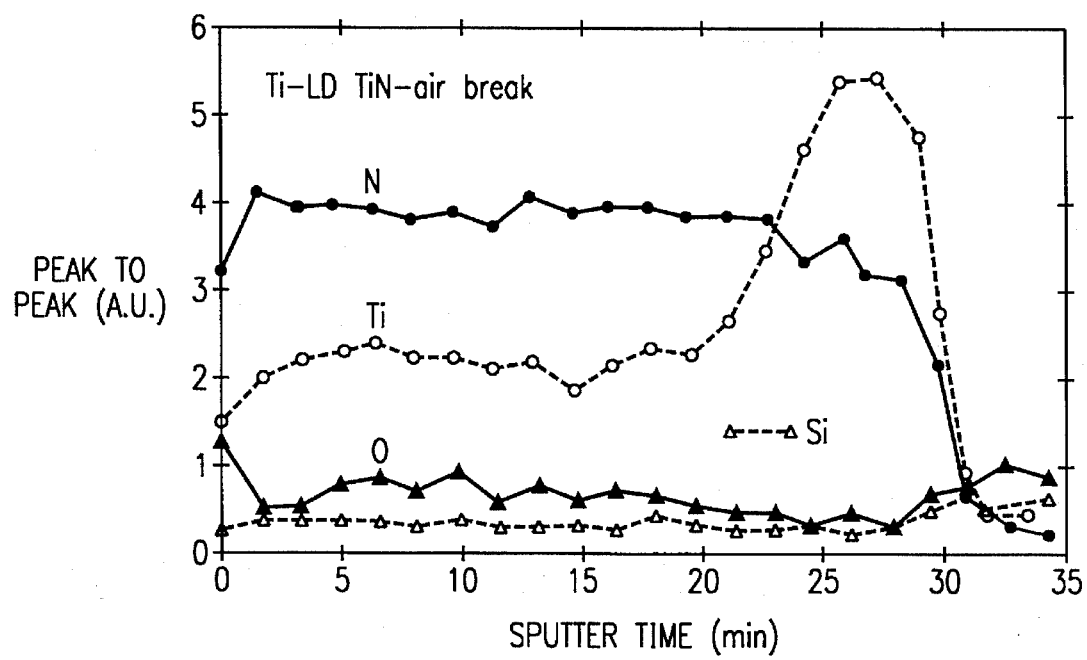
Figure 3D:
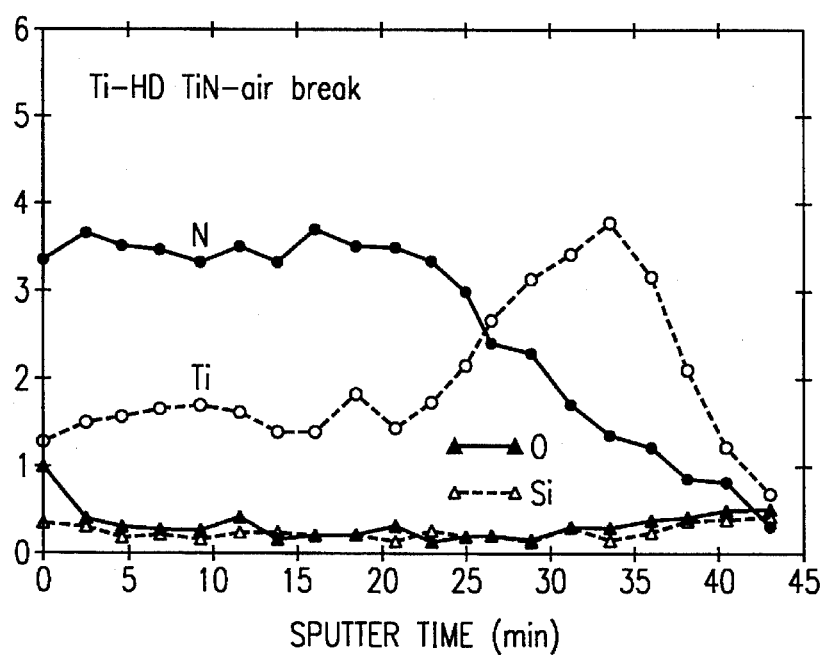

Referring now to FIGS. 3a through 3f, Auger electron spectroscopy (AES) analysis of the barrier structures (i.e., below aluminum) formed according to the six test groups (a) through (f), respectively, are shown. For groups (a) and (b) shown in FIGS. 3a and 3b, respectively, in which aluminum was deposited in situ with the Ti/TiN films, oxygen is not present to a significant degree in either group. Referring to FIGS. 3c and 3d, where aluminum is deposited after exposure to air (an air break), a significant degree of oxygen is present in the low density TiN group (c), while no significant amount of oxygen is evident in the high density TiN group (d); in addition, FIG. 3c illustrates that the nitrogen concentration within the low density TiN film of group (c) is higher, at locations deeper into the film, than that of the high density TiN film of group (d). FIGS. 3c and 3d thus indicate that the low density TiN film formed according to the first embodiment of the invention is stuffed with much more oxygen, and also with more nitrogen, than is the high density TiN film, after exposure of the wafers to air (and before RTA). The presence of more oxygen in the low density TiN film is evident by the higher resistivities noted above.

Figure 3E:
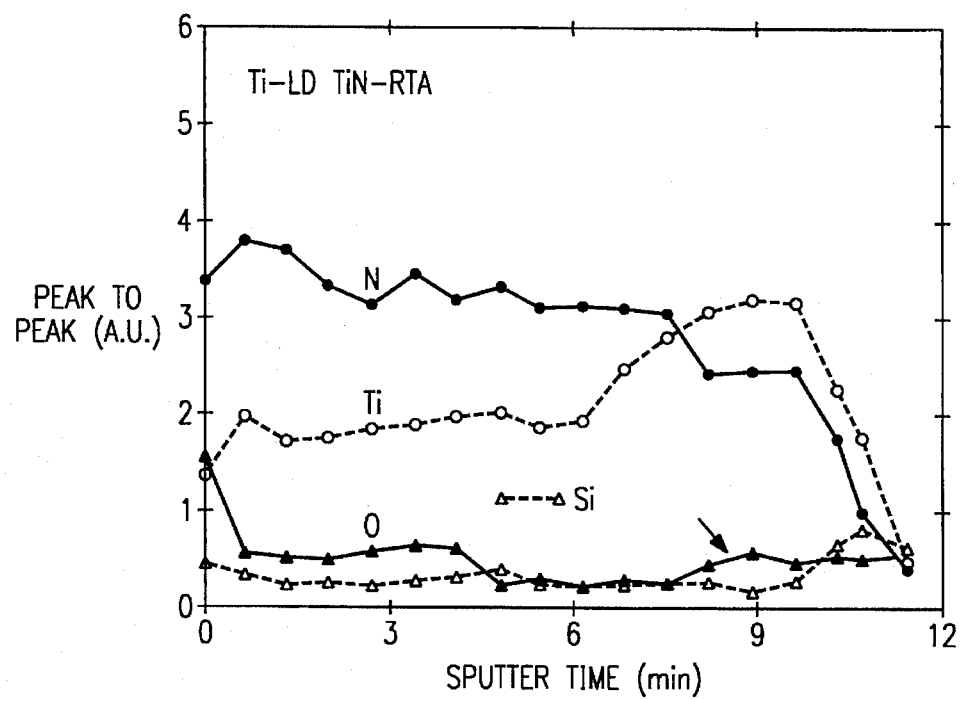
Figure 3F:
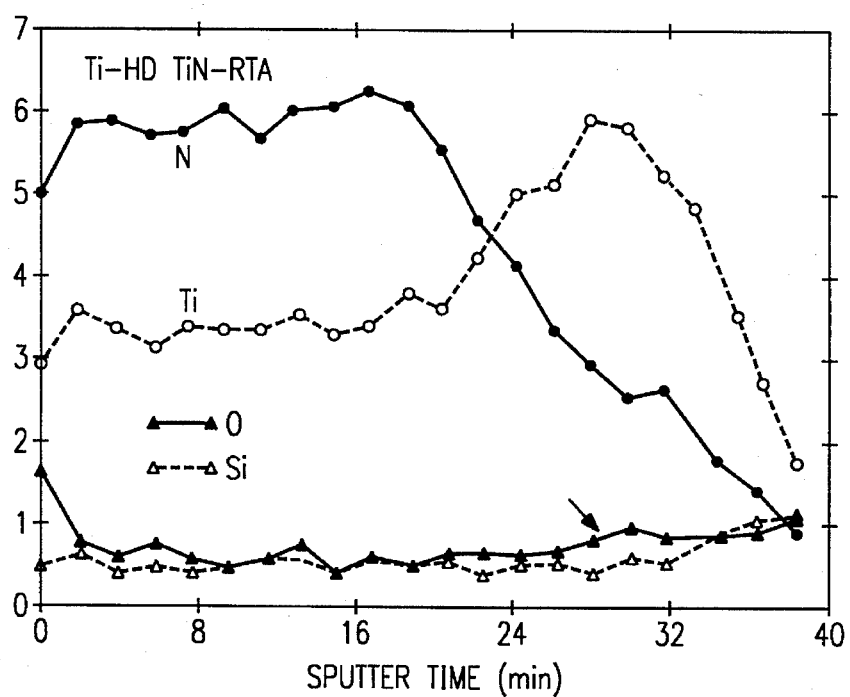

Referring now to FIG. 3e, the AES results of the barrier structure according to the first embodiment of the invention, after RTA, is illustrated; FIG. 3f shows, for comparison, the AES results for a high density film similarly processed, with RTA after air break and before aluminum deposition. It is clear from FIG. 3e that the oxygen stuffed into the TiN film has been gettered at the Ti/TiN interface by the RTA treatment, as indicated by the oxygen peak highlighted by the arrow in FIG. 3e and by the depletion of oxygen from the portion of the film immediately above this peak (seen by comparing FIGS. 3c and 3e). This oxygen gettering is also evident in the high density TiN group (f) in FIG. 3f; however, since less oxygen and less nitrogen are stuffed into the high density TiN film as shown in FIG. 3d, it is believed that the TiON formed at the Ti/TiN interface for this structure will be much thinner. Greater oxygen gettering has therefore occurred at the Ti/TiN interface of the low density TiN film group (e), after RTA, resulting in a high integrity layer of TiON thereat, and improved barrier performance. FIG. 3e also illustrates that the upper portion of the TiN layer is stuffed with oxygen, given the relatively high level of oxygen appearing in the AES results thereat.

The enhanced reaction of nitrogen and oxygen with the titanium metal obtained by this first embodiment of the invention also has the benefit of limiting the silicide thickness, by reducing the amount of elemental titanium available for silicidation. As such, the present invention is particularly applicable to integrated circuits having extremely shallow junctions, where consumption of the junction by the silicidation is of concern.

Figure 4:
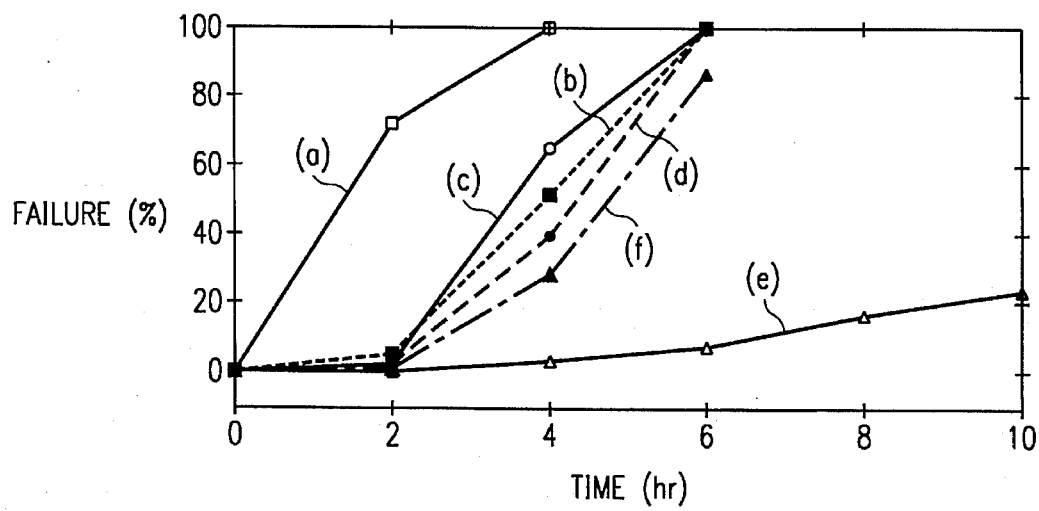
FIG. 4 is a plot of thermal stress hours versus diode failure percentage for the six test groups of FIGS. 3a through 3f.

Following fabrication of the six test groups, diode strings in sample integrated circuits were subjected to thermal stress at 450° C., and the percentage of diode failures noted for each group. FIG. 4 is a plot of the thermal stress results, with the percentage failure on the vertical axis and the stress time on the horizontal axis. It is believed that the thermal stress diode leakage test accurately correlates to barrier integrity, considering that thermal stress accelerates the interdiffusion of aluminum and silicon at contact locations, with failure of the diode junction occurring upon aluminum atoms reaching the metallurgical p-n junction through the barrier. As is evident from FIG. 4, the TiON layer formed according to the first embodiment of the invention provides excellent protection to such interdiffusion, relative to the other test groups, and particularly relative to group (f) having high density TiN and subjected to the air exposure and RTA processes.

Figure 5A:
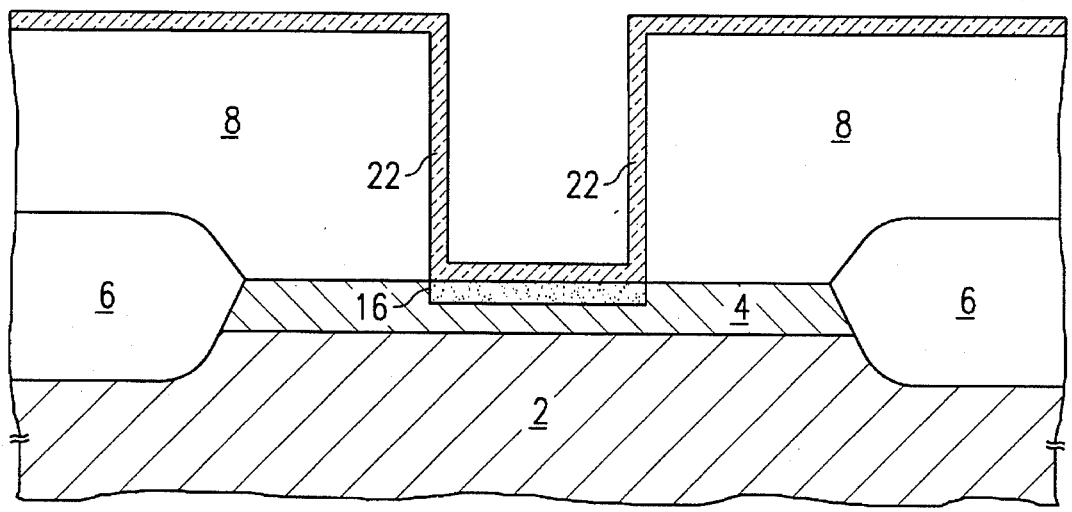
FIGS. 5a through 5c are cross-sectional views of a partially manufactured integrated circuit illustrating steps of a fabrication process according to a second preferred embodiment of the invention.
Figure 5B:
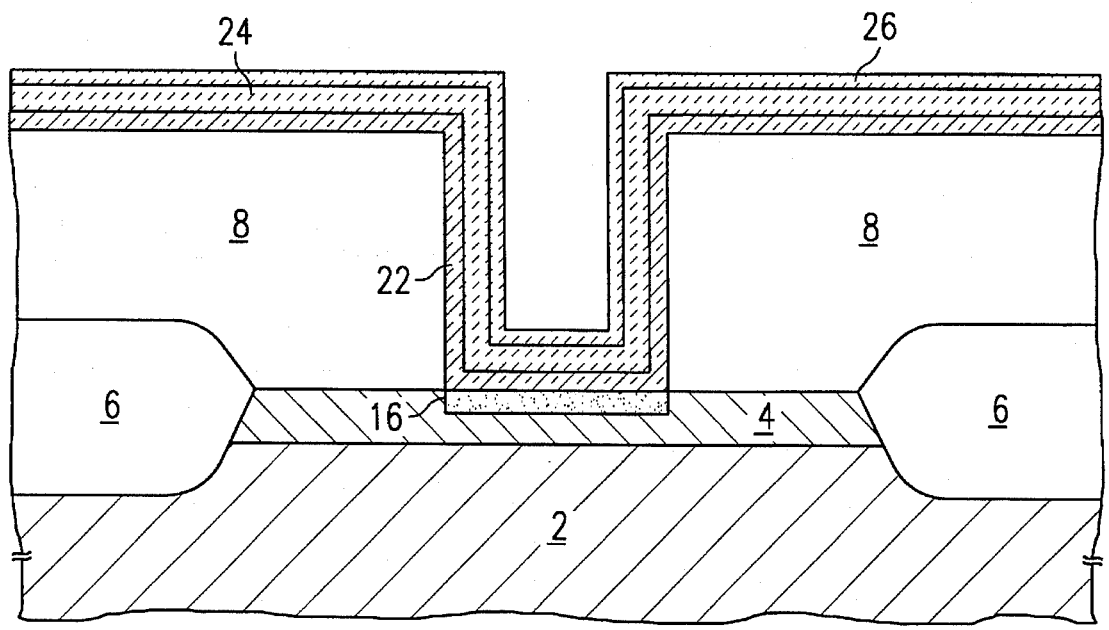
Figure 5C:
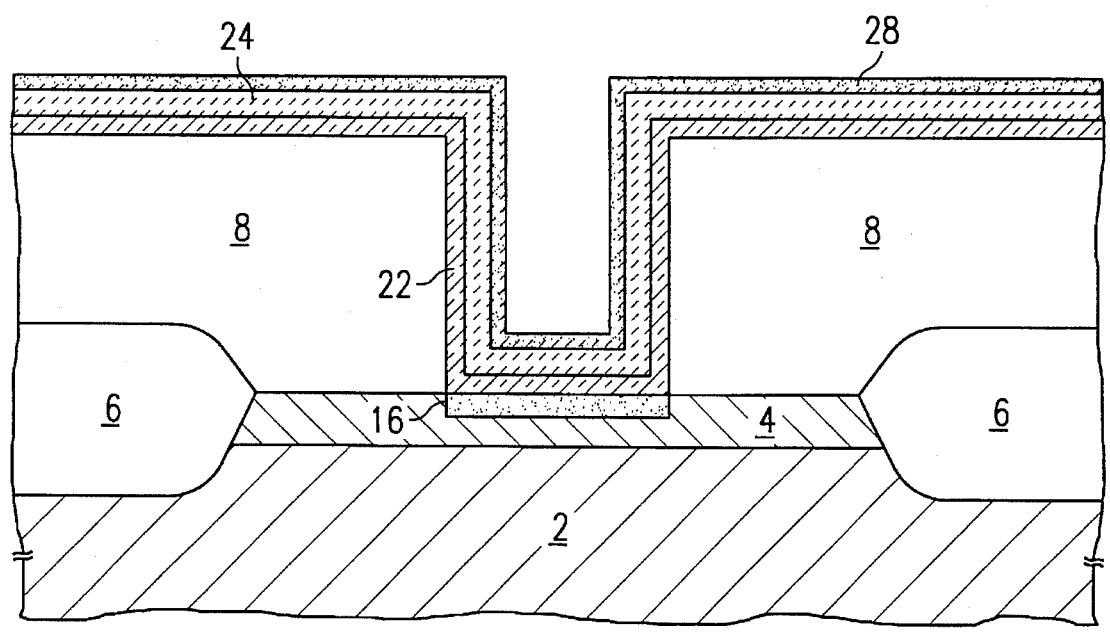

Referring now to FIGS. 5a through 5c, a method of forming a barrier structure in a contact according to a second preferred embodiment of the invention will now be described in detail. In this embodiment of the invention, a titanium layer is first deposited over the structure of FIG. 2a to the desired thickness for formation of the silicide at the contact location, and as such in contact with diffusion 4 and overlying dielectric layer 8. According to this embodiment of the invention, the structure is exposed to air or an oxygen-bearing atmosphere, so that oxygen stuffs the titanium layer. RTA is then performed in a nitrogen atmosphere, reacting the titanium layer with the silicon surface of diffusion 4 to form a silicide thereat, and with the titanium metal reacting with the nitrogen in the atmosphere and also the stuffed oxygen from the air break, resulting in a titanium oxynitride compound elsewhere. The resultant structure is illustrated in FIG. 5a, with silicide layer 16 formed at the bottom of contact opening 9. Titanium oxynitride layer 22 is formed elsewhere over dielectric layer 8, and also at the upper surface of silicide 16, to some extent.

Following the RTA direct reaction of the deposited titanium, and referring to FIG. 5b, titanium nitride layer 24 is sputtered over titanium oxynitride layer 22, and titanium metal layer 26 is then sputtered over titanium nitride layer 24. In this embodiment of the invention, titanium nitride layer 24 may be, and preferably is, of conventional high density. The thickness of layers 24, 26 are selected according to the particular geometry and, in the case of titanium layer 26, considering subsequent processing to ensure that it is fully reacted. For example, titanium nitride layer 24 has a thickness preferably on the order of 500 to 1000 Å, while titanium layer 26 has a thickness preferably on the order of 200 to 700 Å. Titanium nitride layer 24 and titanium layer 26 are preferably sputtered in situ with one another, with the nitrogen source being turned off, and the titanium sputtering continuing, after deposition of titanium nitride layer 24 to the desired thickness. A low density titanium nitride layer may optionally also be sputtered over titanium layer 26, if desired.

After deposition of titanium layer 26, the structure is again exposed to air or another oxygen-bearing atmosphere, so as to stuff titanium layer 26 with oxygen. Following the air break, RTA is again performed as before (with the particular conditions not being critical), in a nitrogen atmosphere, so as to react titanium layer 26 with the stuffed oxygen and the nitrogen ambient to form a titanium oxynitride compound. The resultant structure is illustrated in FIG. 5c, with titanium oxynitride layer 28 formed overall.

This second preferred embodiment of the invention thus results in multiple layers of titanium oxynitride in the barrier structure. It is contemplated that this additional titanium oxynitride layer will further enhance the barrier properties of the contact, at a cost of additional process steps.

Upon fabrication of the structure of FIG. 5c, processing may then continue with the deposition of aluminum metallization, and patterning and etching, to form the desired metal conductors in the circuit, as before. Of course, the process of depositing titanium nitride and titanium, air break, and RTA may be again repeated prior to aluminum deposition, if additional titanium oxynitride layers are desired.

Figure 6A:
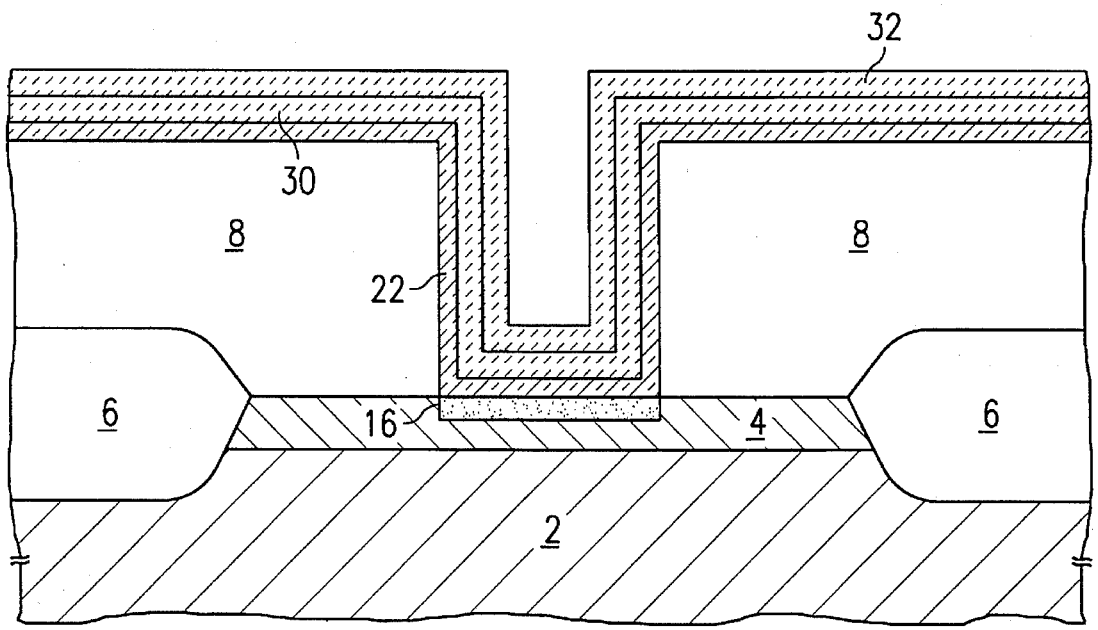
FIGS. 6a and 6b are cross-sectional views of a partially manufactured integrated circuit illustrating steps of a fabrication process according to a third preferred embodiment of the invention.
Figure 6B:
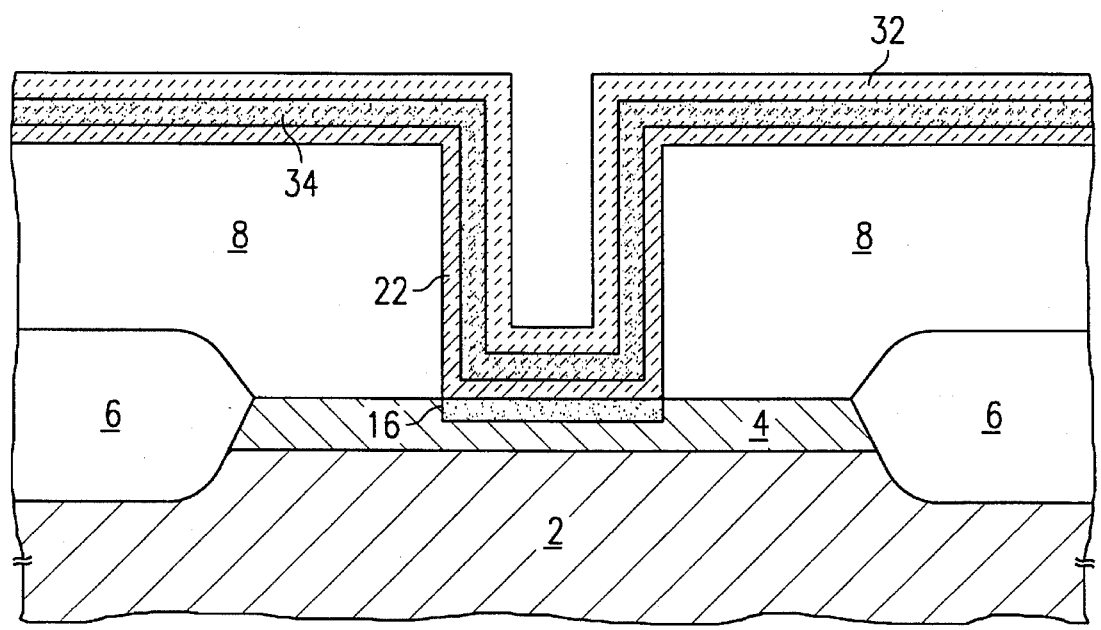

Referring now to FIGS. 6a and 6b, a method of forming a contact with a barrier layer according to a third embodiment of the invention will now be described in detail. In this embodiment of the invention, a titanium metal layer is sputtered into contact opening 9 and, after an air break, is exposed to RTA to form silicide film 16 and titanium oxynitride 22, resulting in a structure as shown in FIG. 5a described above. According to this third embodiment of the invention and as shown in FIG. 6a after the RTA reaction, titanium metal layer 30 is sputtered overall, followed by the sputtering of low density titanium nitride layer 32 over titanium metal layer 30. Low density titanium nitride layer 32 is sputtered under conditions similar to those described hereinabove relative to the first preferred embodiment of the invention, such as low substrate temperature and weak vacuum, resulting in small grain size and high porosity in the film. As before, the sputtering steps forming titanium layer 30 and low density titanium nitride layer 32 are preferably performed in situ with one another. The resulting structure is illustrated in FIG. 6a.

The structure is then exposed to air or an oxygen-bearing atmosphere so that oxygen stuffs low density titanium nitride layer 32, in the manner described hereinabove relative to the first preferred embodiment of the invention. Following the air break, the structure undergoes RTA in nitrogen atmosphere to cause the gettering of the stuffed oxygen at the titanium/titanium nitride interface, where the stuffed oxygen and the available nitrogen react with elemental titanium in layer 30 to form a titanium oxynitride compound thereat. The resulting structure is illustrated in FIG. 6b, where second titanium oxynitride layer 34 overlies titanium oxynitride layer 22 that was previously formed, and underlies titanium nitride layer 32. As described hereinabove, it is contemplated that low density titanium nitride layer 32 is densified during the RTA, and also is stuffed with oxygen near its surface.

As a result of this third preferred embodiment of the invention, a double thickness of titanium oxynitride is formed in contact locations, thus further enhancing the barrier presented to later deposited aluminum metallization. After aluminum deposition, of course, patterning and etching will follow to form the desired metal conductors in the circuit, as before. If desired, the deposition of titanium metal and low density titanium nitride, air break, and RTA may be repeated again prior to aluminum deposition, if another layer of titanium oxynitride in the barrier structure is desired.

A fourth preferred embodiment of the invention is also contemplated, in the formation of a barrier structure incorporating titanium oxynitride. In this fourth preferred embodiment of the invention, titanium metal is sputtered overall, in contact with diffusion 4 and dielectric layer 8, exposed to air, and subjected to RTA to form silicide at the bottom of the contact opening and titanium oxynitride elsewhere, resulting in the structure shown in FIG. 5a. According to this fourth embodiment of the invention, however, titanium oxynitride film is directly sputtered onto the first titanium oxynitride film formed by RTA; it is contemplated that the introduction of a controlled amount of oxygen and nitrogen into the sputtering system will enable the reactive sputtering of titanium oxynitride film thereover. This deposition of titanium oxynitride will serve to thicken the barrier layer resulting from the RTA silicidation reaction, and enhance the barrier effects thereat. This embodiment of the invention also provides a convenient way in which to form the barrier structure, without requiring removal of the structure from the sputtering apparatus for additional processing.

According to this fourth embodiment of the invention, after reactive sputtering of the titanium oxynitride layer, an additional layer of titanium nitride may be sputtered thereover, if desired. This additional titanium nitride layer may be, and preferably is, of high density, as the underlying titanium oxynitride layer has already been formed over the structure. Whether or not this additional layer is formed, the structure may be subjected to RTA, if necessary to more completely react the titanium oxynitride layer in the structure. Processing may then continue with the deposition, patterning and etching of aluminum over the barrier structure, to form the desired electrical conductors in the integrated circuit.

In each of the embodiments of the invention described hereinabove, a high integrity, high quality barrier layer is produced by the incorporation of titanium oxynitride near the silicide film cladding the silicon at the bottom of the contact. This compound has been found to provide excellent barrier properties, as evidenced by the reduced diode failure rate under thermal stress. The various embodiments of the invention are directed to novel methods of providing a titanium oxynitride film of adequate thickness and integrity to provide the desired barrier performance.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit contact structure, comprising:
   a doped semiconducting region at the surface of a body;
   a dielectric film disposed over the doped region, the dielectric film having a contact opening therethrough;
   a titanium silicide film disposed at an exposed portion of the doped region in the contact opening;
   a first titanium oxynitride film overlying the titanium silicide film in the contact opening;
   a first titanium nitride film overlying the titanium silicide film in the contact opening, wherein the first titanium nitride film comprises:
   a first layer, in contact with the first titanium oxynitride film; and
   a second layer, overlying the first layer, and having a higher concentration of oxygen than the first layer; and,
   a metallization layer comprising aluminum overlying the first titanium oxynitride film and the first titanium nitride film.

2. The structure of claim 1, wherein the first titanium oxynitride film comprises thermal titanium oxynitride.

3. The structure of claim 1, wherein the first titanium nitride film overlies the first titanium oxynitride film.

4. The structure of claim 3, further comprising a second titanium oxynitride film overlying the first titanium nitride film.

5. The structure of claim 4, further comprising a second titanium nitride film overlying the second titanium oxynitride film.

6. The structure of claim 1, further comprising a second titanium oxynitride film overlying the first titanium oxynitride film.

7. The structure of claim 1, wherein the first titanium oxynitride film is formed by reactive sputter deposition.

8. An integrated circuit contact structure, comprising:
   a doped semiconducting region at the surface of a body;
   a dielectric film disposed over the doped region, the dielectric film having a contact opening therethrough;
   a titanium silicide film disposed at an exposed portion of the doped region in the contact opening;
   a first titanium oxynitride film overlying the titanium silicide film in the contact opening;
   a second titanium oxynitride film overlying the first titanium oxynitride film;
   a first titanium nitride film overlying the titanium silicide film in the contact opening, wherein the first titanium nitride film overlies both the first and second titanium oxynitride films, and comprises:
   a first layer, in contact with the second titanium oxynitride film; and
   a second layer, adjacent the first layer, and having a higher concentration of oxygen than the first layer; and,
   a metallization layer comprising aluminum overlying the first titanium oxynitride film and the first titanium nitride film.

9. The structure of claim 8, further comprising:
   a third titanium oxynitride film overlying the first titanium nitride film; and
   a second titanium nitride film overlying the third titanium oxynitride film.

* * * * *